United States Patent
Cheng (10) Patent No.: US 11,339,816 B2
(45) Date of Patent: May 24, 2022

(54) FASTENING AND RELEASING PUSHING MODULE

(71) Applicant: Getac Technology Corporation, Hsinchu County (TW)

(72) Inventor: Kuo-Heng Cheng, Taipei (TW)

(73) Assignee: GETAC TECHNOLOGY CORPORATION, Hsinchu County (TW)

( * ) Notice: Subject to any disclaimer, the term of this patent is extended or adjusted under 35 U.S.C. 154(b) by 896 days.

(21) Appl. No.: 16/157,501

(22) Filed: Oct. 11, 2018

(65) Prior Publication Data

US 2020/0116181 A1 Apr. 16, 2020

(51) Int. Cl.
*F16B 5/06* (2006.01)
*H05K 7/16* (2006.01)
*G06F 1/16* (2006.01)

(52) U.S. Cl.
CPC .......... *F16B 5/0621* (2013.01); *G06F 1/1632* (2013.01); *H05K 7/16* (2013.01)

(58) Field of Classification Search
CPC ............ F16B 2200/20; F16B 2200/205; F16B 5/0621
USPC ............... 361/361, 679.41, 679.43; 403/321, 403/322.1, 322.3, 322.4, 325, 326, 327, 403/330
See application file for complete search history.

(56) References Cited

U.S. PATENT DOCUMENTS

| | | | | |
|---|---|---|---|---|
| 5,737,541 A * | 4/1998 | Shimizu | ................ | G06F 1/1632 361/679.41 |
| 5,882,220 A * | 3/1999 | Horii | .................... | H01R 13/639 439/297 |
| 6,093,039 A * | 7/2000 | Lord | ...................... | G06F 1/1632 361/679.41 |
| 7,751,185 B2 * | 7/2010 | Yu | .......................... | G06F 1/1632 361/679.41 |
| 10,248,162 B1 * | 4/2019 | Cheng | .................. | F16M 11/041 |
| 10,348,026 B1 * | 7/2019 | Cheng | .................. | H01R 13/447 |
| 2003/0147209 A1 * | 8/2003 | Oross | ..................... | G06F 1/1632 439/376 |
| 2004/0012922 A1 * | 1/2004 | Kamphuis | ............. | G06F 1/1632 361/679.02 |
| 2012/0212910 A1 * | 8/2012 | Katsuta | ................. | G06F 1/1616 361/747 |

* cited by examiner

*Primary Examiner* — Jonathan P Masinick
(74) *Attorney, Agent, or Firm* — Locke Lord LLP; Tim Tingkang Xia, Esq.

(57) ABSTRACT

A fastening and releasing pushing module includes a base, a pivot shaft provided at the base, a fastening portion provided at the pivot shaft, two pushing members provided at the pivot shaft, two elastic members, and a releasing switch. Each pushing members includes a body and a positioning shaft assembled at the body. One end of each of the elastic elements is directly connected to the positioning shaft of the pushing member, and the other end is connected to the base. The releasing switch is provided at the pivot shaft, and is movable between a fastening position and a releasing pushing position. When the releasing switch moves to the fastening position or the releasing pushing position, the releasing switch drives the pivot shaft to rotate, such that the fastening portion and the pushing members simultaneously rotate to the fastening position or the releasing pushing position.

10 Claims, 7 Drawing Sheets

FASTENING AND RELEASING PUSHING MODULE

BACKGROUND OF THE INVENTION

Field of the Invention

The present invention relates to fastening and releasing pushing modules and, more particularly, to a fastening and releasing pushing module in which a fastening portion and pushing members can simultaneously rotate.

Description of the Prior Art

With the popularity of electronic devices, easy portability of the electronic devices has become one critical index for a consumer in choosing and purchasing an electronic device. As electronic devices continue to become more readily portable, the volume of the electronic devices are also ever-decreasing in order to be slimmer and lighter, and functions or communication ports on the electronic devices are also more simplified. Thus, to provide an electronic device with expanded functions when using the electronic device, an electronic device is usually mounted to a docking station with functions or communication ports. However, common docking stations may still suffer from issues of inconvenience in use and complicated structures.

SUMMARY OF THE INVENTION

The present invention discloses a fastening and releasing pushing module including a base, a pivot shaft, a fastening portion, two pushing members, two elastic elements and a releasing switch. The pivot shaft is provided at the base. The fastening portion is provided at the pivot shaft. The pushing members are provided at the pivot shaft, and each includes a body and a positioning shaft, wherein the positioning shaft is assembled at the body. One end of each of the elastic elements is directly connected to the positioning shaft of the pushing member, and the other end is connected to the base. The releasing switch is provided at the pivot shaft, and is movable between a fastening position and a releasing pushing position. When the releasing switch moves to the fastening position or the releasing pushing position, the releasing switch drives the pivot shaft to rotate, such that the fastening portion and the pushing members simultaneously rotate to the fastening position or the releasing pushing position.

Thus, a user can quickly switch between the fastening position and the releasing pushing position by pressing the pushing members or the releasing switch, thus providing convenience of use.

DETAILED DESCRIPTION OF THE EMBODIMENTS

Figure 1:
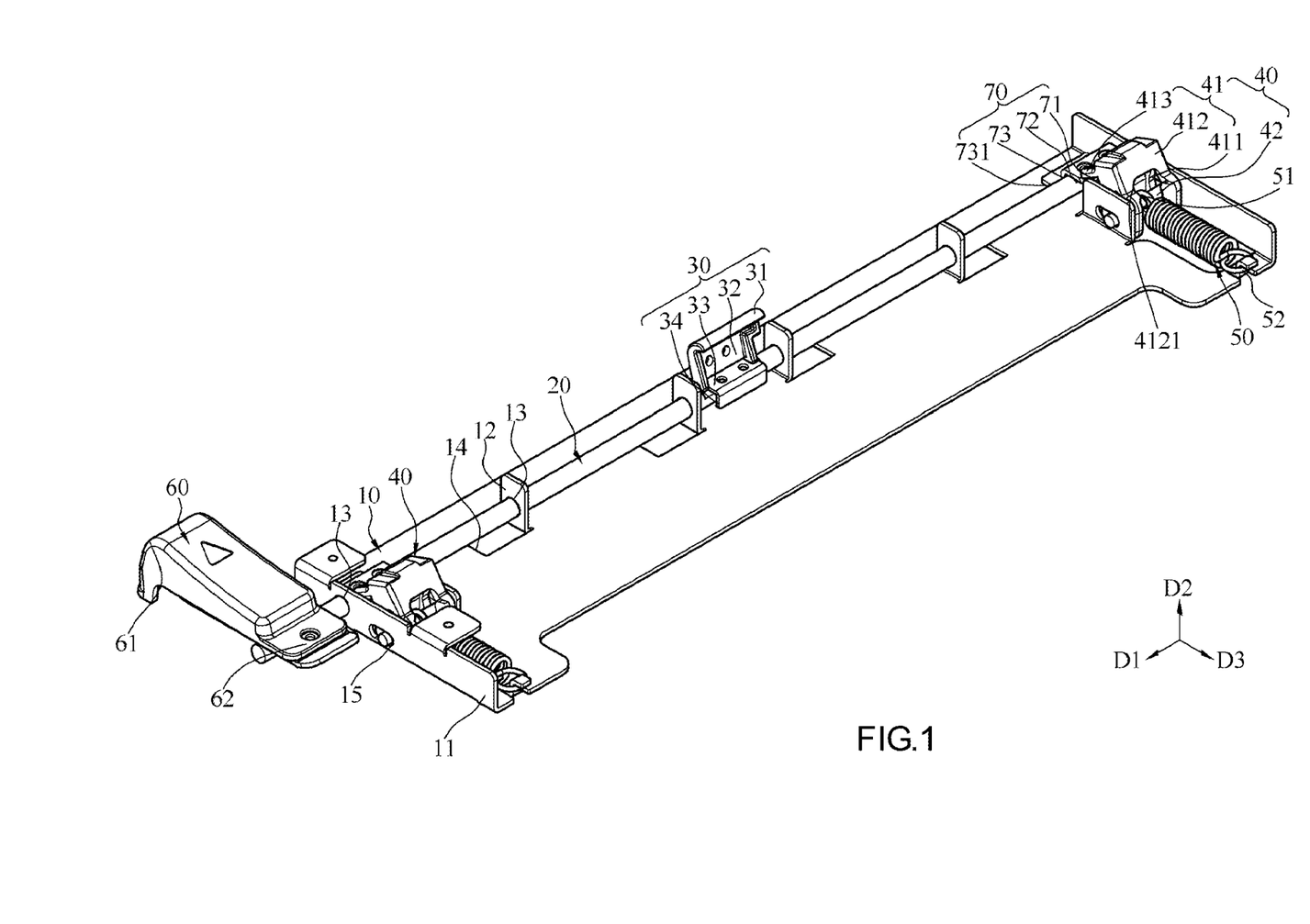
FIG. 1 is a perspective structural schematic diagram of a fastening and releasing pushing module at a releasing pushing position according to an embodiment of the present invention.
Figure 2:
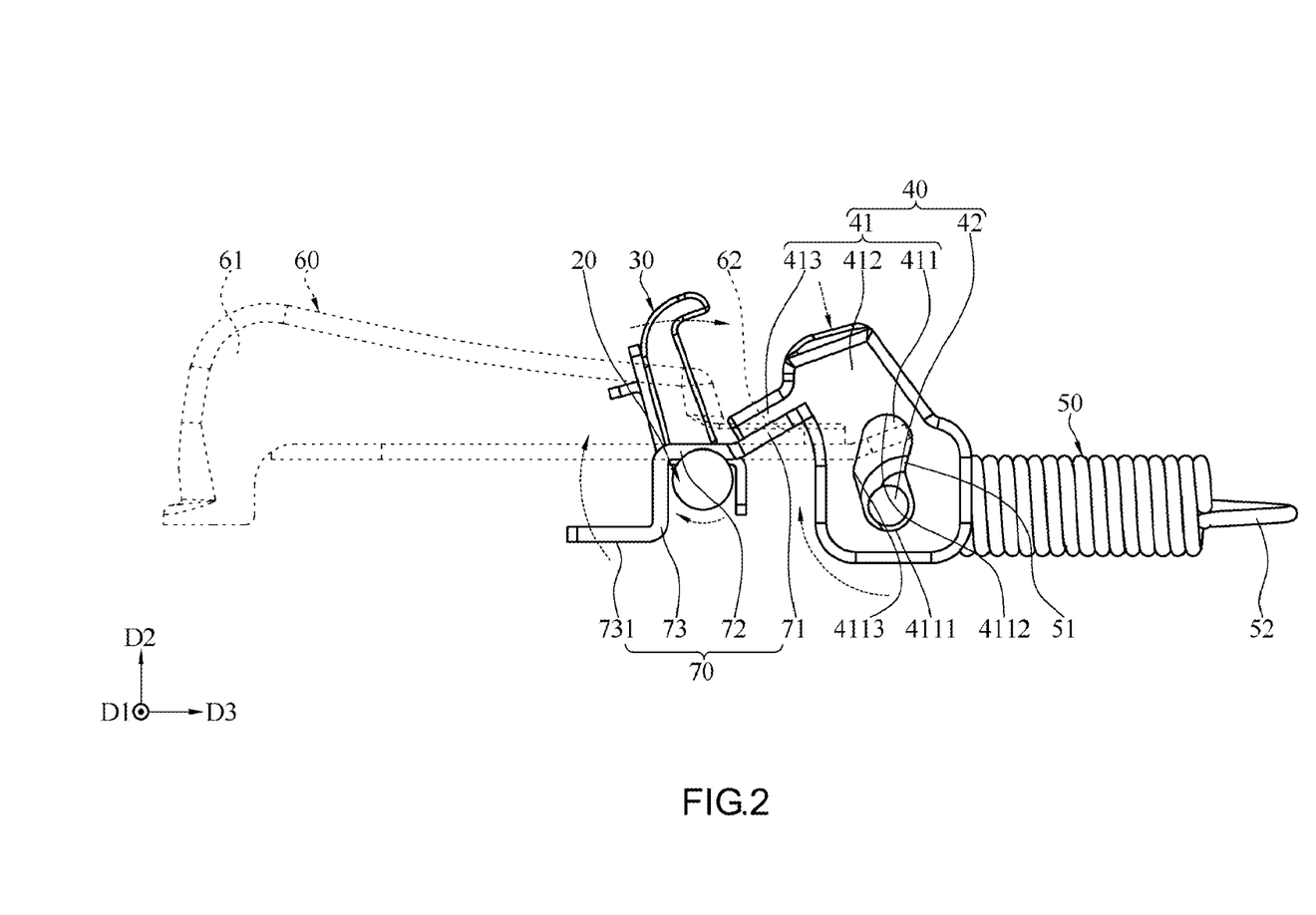
FIG. 2 is a cross-sectional diagram of a fastening and releasing pushing module at a releasing pushing position according to an embodiment of the present invention.

Refer to FIG. 1 and FIG. 2. FIG. 1 shows a perspective structural schematic diagram of a fastening and releasing pushing module at a releasing pushing position according to an embodiment of the present invention. FIG. 2 shows a cross-sectional diagram of a fastening and releasing pushing module at a releasing pushing position according to an embodiment of the present invention. The fastening and releasing pushing module of the present invention is adapted to fasten and release an electronic device.

Again referring to FIG. 1 and FIG. 2, as shown in FIG. 1, the fastening and releasing pushing module includes a base 10, a pivot shaft 20, a fastening portion 30, two pushing members 40, two elastic elements 50 and a releasing switch 60. The pivot shaft 20 is rotatably provided at the base 10. The fastening portion 30, the pushing members 40 and the releasing switch 60 are provided at the pivot shaft 20 and can operate synchronously with the pivot shaft 20. Each of the pushing members 40 includes a body 41 and a positioning shaft 42, wherein the positioning shaft 42 is assembled at the body 41. One end of each of the elastic elements 50 is directly connected to the positioning shaft 42 of the corresponding pushing member 40, and the other end is connected to the base 10. Accordingly, the releasing switch 60 is movable between a fastening position and a releasing pushing position. When the releasing switch 60 moves to the fastening position or the releasing pushing position, the releasing switch 60 drives the pivot shaft 20 to rotate, such that the fastening portion 30 and the pushing members 40 simultaneously rotate to the fastening position or the releasing pushing position.

Referring to FIG. 1, in one embodiment, the base 10 is a single structural body. More specifically, the base 10 may be a single plate structure. To facilitate the rotatable configuration of the pivot shaft 20 on the base 10, in one embodiment, two opposite sides of the base 10 are integrally bent to form sidewalls 11, and the range between the sidewalls 11 is integrally bent to form a plurality of vertical walls 12. A pivot opening 13 is provided on each of the sidewalls 11 and the vertical walls 12, wherein the pivot openings 13 on the sidewalls 11 and the vertical walls 12 are coaxially provided. Accordingly, the pivot shaft 20 can pass through and be rotatably provided in the pivot openings 13 on the sidewalls 11 and the vertical walls 12 of the base 10.

More specifically, in one embodiment, the base 10 may be a metal plate, and the sidewalls 11 are formed by directly bending two opposite sides of the base 10. Regarding the method for forming the vertical walls 12, an inverted U-shaped notch 14 is first provided on the base 10, and the vertical walls 12 are formed by bending along the notch 14. Accordingly, the number of the vertical walls 12 of the base 10 can be changed depending on the length of the pivot shaft 20 to be adapted to pivot shafts 20 with different specifications. The methods for forming the sidewalls 11 and the vertical walls 12 described above are merely illustrative examples, and the present invention is not limited to the above examples.

Again referring to FIG. 1, in one embodiment, the pivot shaft 20 passes through and is rotatably provided in the pivot openings 13 of the sidewalls 11 and the vertical walls 12 on the base 10, and one end of the pivot shaft 20 penetrates through the base 10 from one of the sidewalls 11.

Again referring to FIG. 1 and FIG. 2, in one embodiment, the fastening portion 30 includes a fastening end 31, an extension portion 32 and a connecting section 33 sequentially engaged. There is an included angle between the fastening end 31 and the extension portion 32 for fastening an electronic device, and the connecting section 33 is for fastening onto the pivot shaft 20. At this point, the connecting section 33 of the fastening portion 30 is a planar surface, and a position on the pivot shaft 20 corresponding to the connecting section 33 is also a planar surface, so as to allow the fastening portion 30 to be securely attached to the pivot shaft 20. Furthermore, in one embodiment, the fastening portion 30 may further include a stop section 34 that is engaged with the connecting section 33, and there is an included angle between the stop section 34 and the connecting section 33. Thus, when the fastening portion 30 is fixed at the pivot shaft 20 through the connecting section 33, the stop section 34 can simultaneously abut against the surface of the pivot shaft 20 and accordingly generate a unidirectional displacement constraint on the fastening portion 30, thus increasing the stability of the fastening portion 30.

Again referring to FIG. 1 and FIG. 2, in one embodiment, the pushing members 40 are fixedly provided at the pivot shaft 20 and synchronously move with the pivot shaft 20. The positioning shafts 42 pass through and are provided on the bodies 41; that is, each body 41 is sleeved on the positioning shaft 42 and moves accordingly. At this point, the two pushing members 40 are provided on two opposite sides of the fastening portion 30 on the pivot shaft 20.

Further referring to FIG. 2, in one embodiment, the body 41 has a guide positioning groove 411, the positioning shaft 42 passes through and is provided at the guide positioning groove 411, and the body 41 is sleeved around the positioning shaft 42 and displaces under the constraint of the positioning shaft 42.

Referring to FIG. 2, in one embodiment, the body 41 consists of a swing seat 412 and a tongue 413. The swing seat 412 is a hollow seat structure, and the tongue 413 is engaged with one side of an outer peripheral surface of the swing seat 412. At this point, the tongue 413 of the body 41 can be driven by the pivot shaft 20 to drive the swing seat 412 to swing relative to the pivot shaft 20. In this embodiment, the swing seat 412 is provided with the guide positioning grooves 411 respectively on the two opposite sides, and the positioning shaft 42 passes through and is provided at the guide positioning grooves 411 of the swing seat 412 in a manner that the positioning shaft 42 is parallel to the pivot shaft 20.

Again referring to FIG. 2, more specifically, each of the guide positioning grooves 411 appears roughly as a lopsided L-shape, and includes a first positioning end 4111, a second positioning end 4112 and a bent portion 4113 between the first positioning end 4111 and the second positioning end 4112. At this point, the bent portion 4113 has an included angle greater than 90 degrees and smaller than 180 degrees. Furthermore, the pivot shaft 20 and the positioning shaft 42 extend along a first direction D1, and the first positioning end 4111 is, in a second direction D2 perpendicular to the first direction D1, farther away from the tongue 413 compared to the second positioning end 4112.

As such, when the positioning shaft 42 is located at the first positioning end 4111 or the second positioning end 4112, the pushing member 40 is located at the releasing pushing position or the fastening position. After the positioning shaft 42 moves from the first positioning end 4111 through the bent portion 4113 to the second positioning end 4112, the bent portion 4113 achieves an effect of preventing the positioning shaft 42 from easily returning to the first positioning end 4111 from the second positioning end 4112. Similarly, after the positioning shaft 42 moves from the second positioning end 4112 through the bent portion 4113 to the first positioning end 4111, the bent portion 4113 achieves an effect of preventing the positioning shaft 42 from easily returning to the second positioning end 4112 from the first positioning end 4111. Thus, the stability of the pushing member 40 staying at the fastening position or the releasing pushing position is ensured.

Referring to FIG. 1, in one embodiment, each of the elastic elements 50 is an extension spring. At this point, the swing seat 412 of the body 41 further has a yielding opening 4121 through which the elastic element 50 is extended into the swing seat 412 to connect to the positioning shaft 42. Further, a first positioning hook 51 and a second positioning hook 52 are respectively provided at two ends of the elastic element 50, wherein the first positioning hook 51 of the elastic element 50 is stretched into the swing seat 412 and is hooked at the positioning shaft 42 and the second positioning hook 52 is hooked at the base 10. At this point, the direction of a connecting line between the two ends of the elastic element 50 extends along a third direction D3 perpendicular to the first direction D1 and the second direction D2.

Further, in this embodiment, as the elastic element 50 is an extension spring, a constantly tightened state exists between the two ends of the elastic element 50, and an elastic restoring force is stored when the elastic element 50 is extended so as to restore to an original state when the extension force is released. Referring to FIG. 2, from the perspective of the third direction D3, the first positioning end 4111 and the second positioning end 4112 of the guide positioning groove 411 of the pushing member 40 are closer to the second positioning hook 52 of the elastic element 50 compared to the bent portion 4113. Thus, when the elastic element 50 is not extended, the tightening force between the first positioning hook 51 and the second positioning hook 52 of the elastic element 50 keeps the pushing member 40 as being restrained at the position of the first positioning end 4111 or the second positioning end 4112 of the guide positioning groove 411 and stably corresponding to the positioning shaft 42.

Referring to FIG. 1 and FIG. 2, the releasing switch 60 is provided at a position of the pivot shaft 20 extending out of the base 10 and is capable of driving the pivot shaft 20 to rotate pivotally. More specifically, the releasing switch 60 includes an operation end 61 and a passive end 62 opposite to each other. At this point, a position between the operation end 61 and the passive end 62 of the releasing switch 60 is fixedly provided on the pivot shaft 20. Accordingly, a user can drive the pivot shaft 20 to rotate through pressing the operation end 61. Further, after providing the releasing switch 60 and the pushing member 40 on the pivot shaft 20, in the third direction D3, the operation end 61 of the releasing switch 60 and the body 41 of the pushing member 40 on the pivot shaft 20 are respectively located on the two sides of the fastening portion 30. Thus, by downwardly pressing the operation end 61 of the releasing switch 60 and downwardly pressing the body 41 of the pushing member 40, the pivot shaft 20 and the fastening portion 30 thereon are driven to rotate in opposite directions.

Figure 4:
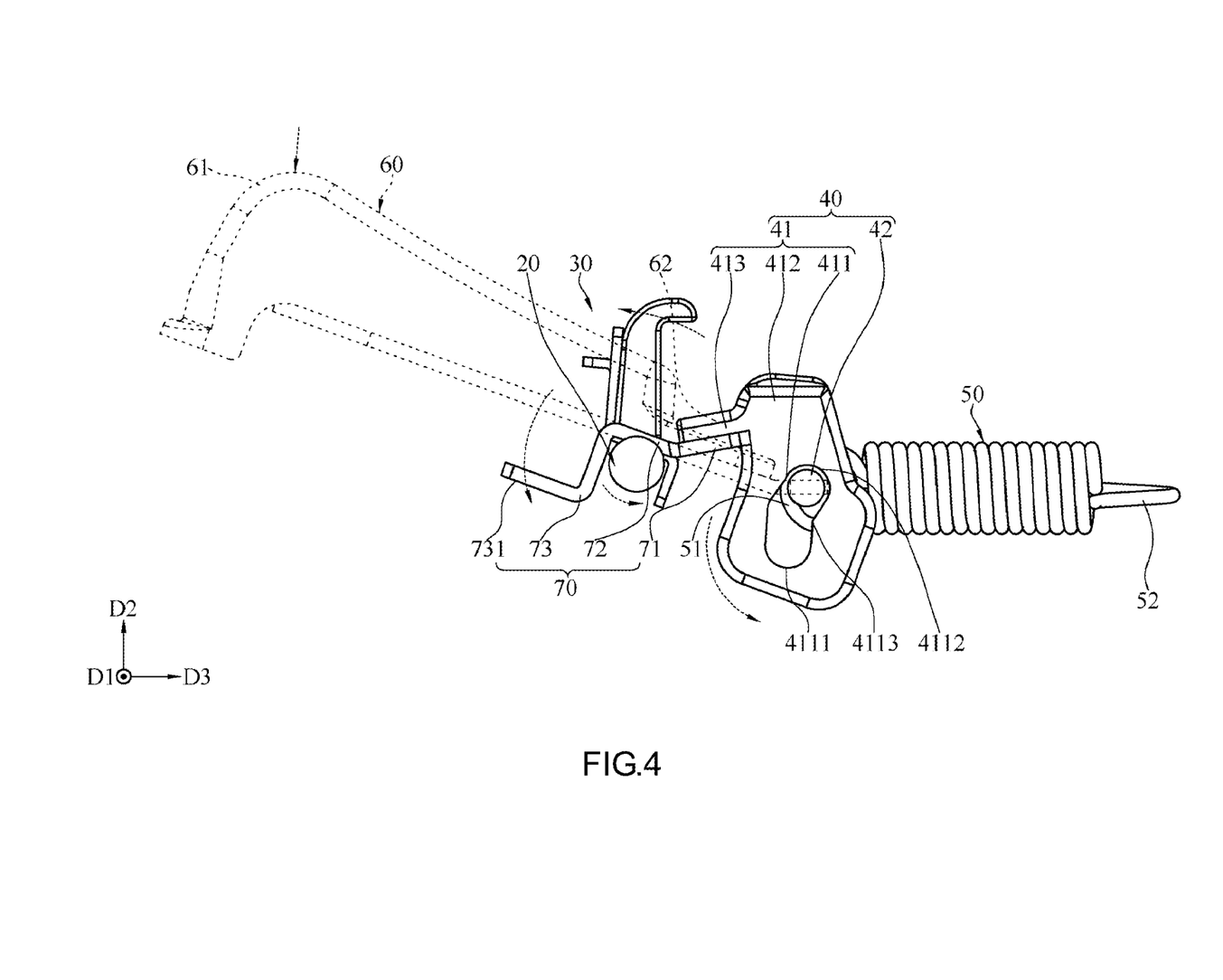
FIG. 4 is a cross-sectional diagram of a fastening and releasing pushing module at a fastening position according to an embodiment of the present invention.

Referring to FIG. 2 as well as FIG. 4, FIG. 4 shows a cross-sectional diagram of a fastening and releasing pushing module at a fastening position according to an embodiment of the present invention. From perspectives of FIG. 2 and FIG. 4, according to the embodiment in FIG. 2, downwardly pressing the body 41 of the pushing member 40 drives the pivot shaft 20 to rotate clockwise; according to the embodiment in FIG. 4, downwardly pressing the operation end 61 of the releasing switch 60 drives the pivot shaft 20 to rotate counterclockwise. The rotation directions of the pivot shaft 20 driven by downwardly pressing the pushing member 40 or by downwardly pressing the releasing switch 60 are only illustrative examples, and the present invention is not limited to the above examples.

Specific details of a state of use of an embodiment of the present invention are given below. Referring to FIG. 1 and FIG. 2 which show a state of the fastening and releasing pushing module located at a releasing pushing position. At the releasing pushing position, the first positioning end 4111 of the guide positioning groove 411 of the pushing member 40 corresponds to the position of the positioning shaft 42, and the fastening portion 30 is in a released state relative to an electronic device. In this state, no fastening force exists between the fastening and releasing pushing module and the electronic device.

Figure 3:
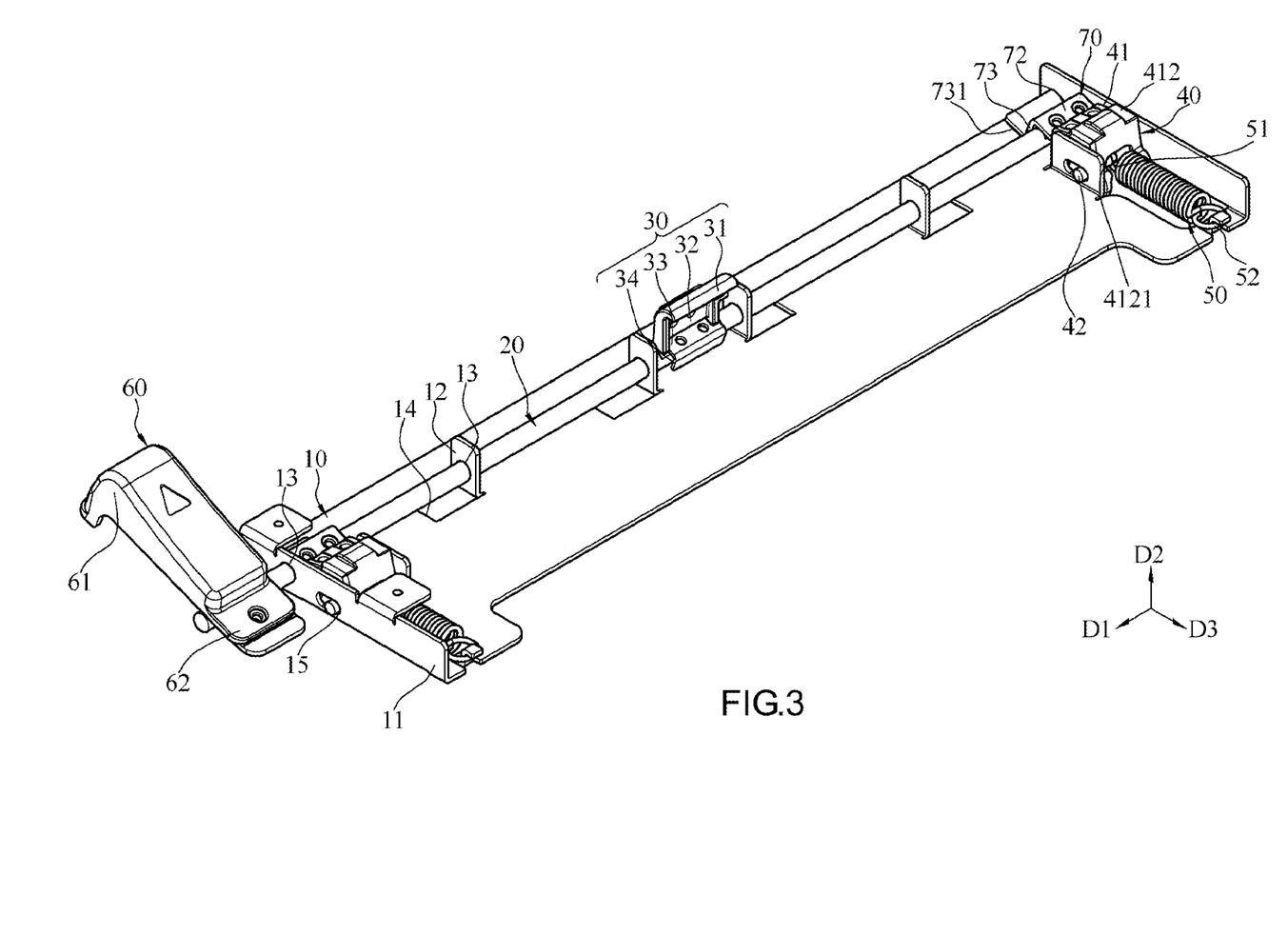
FIG. 3 is a perspective structural schematic diagram of a fastening and releasing pushing module at a fastening position according to an embodiment of the present invention.

To mount the electronic device at the fastening and releasing pushing module, the electronic device can be directly placed on the base 10 to have the electronic device press against the body 41 of each of the pushing members 40. When the body 41 of the pushing member 40 receives a force, the body 41 of the pushing member 40 drives the pivot shaft 20 through the tongue 413 to rotate, and the swing seat 412 of the body 41 at the same pivotally swings relative to the pivot shaft 20. When the body 41 pivotally swings, the state of the first positioning end 4111 of the guide positioning groove 411 originally corresponding to the positioning shaft 42 is changed due to the pivotal swinging of the swing seat 412 to further change the position of the guide positioning groove 411, further gradually changing the position of the second positioning end 4112 of the guide positioning groove 411 relative to the position of the positioning shaft 42. The fastening position shown in FIG. 3 and FIG. 4 is eventually formed, wherein FIG. 3 shows a perspective structural schematic diagram of the fastening and releasing pushing module at a fastening position according to an embodiment of the present invention.

During the pivotal swinging of the body 41, the position of the guide positioning groove 411 of the body 41 relative to the positioning shaft 42 is changed from the first positioning end 4111 through the bent portion 4113 and then to the second positioning end 4112. At this point, in the third direction D3, the position of the first positioning hook 51 of the elastic element 50 directly connected to the positioning shaft 42 changes along with the state of the guide positioning groove 411.

Since a distance of the bent portion 4113 in the third direction D3 relative to the second positioning hook 52 of the elastic element 50 is greater than a distance of the first positioning end 4111 in the third direction D3 relative to the second positioning hook 52, that is, when the guide positioning groove 411 changes from the position of the first positioning end 4111 relative to the positioning shaft 42 to the position of the bent portion 4113 relative to the positioning shaft 42, a distance of the first positioning hook 51 of the elastic element 50 in the third direction D3 relative to the second positioning hook 52 is increased. As such, the elastic element 50 between the first positioning hook 51 and the second positioning hook 52 is extended and an elastic force is at the same time stored therebetween.

When the guide positioning groove 411 changes from the position of the bent portion 4113 relative to the positioning shaft 42 to the position of the second positioning end 4112 relative to the positioning shaft 42, the distance of the first positioning hook 51 of the elastic element 50 in the third direction D3 relative to the second positioning hook 52 is shortened. At this point, the stored elastic force of the elastic element 50 is released and the elastic element 50 is restored to a tightened form, and the tightening force of the elastic element 50 enables the pushing member 40 to be stably located at the position of the second positioning end 4112 relative to the positioning shaft 42. In this state, the pushing member 40 is changed from the releasing pushing position to the fastening position.

Further, while the state of the pushing member 40 is changed, because the pushing member 40 is provided at the pivot shaft 20, the pivotal swinging of the pushing member 40 also simultaneously drives the pivot shaft 20 to rotate, and the fastening portion 30 provided on the pivot shaft 20 also produces a pivotal swinging motion to change to the fastening position and further be stably combined with the electronic device.

Next, after the use of the electronic device and the combined state between the electronic device and the fastening and releasing pushing module is to be released, referring to FIG. 3 and FIG. 4, by pressing the operation end 61 of the releasing switch 60, the releasing switch 60 can drive the pivot shaft 20 to rotate. In one embodiment, downwardly pressing the operation end 61 of the releasing switch 60 and downwardly pressing the body 41 of the pushing member 40 can drive the pivot shaft 20 to rotate in reverse. Thus, after pressing the operation end 61 of the releasing switch 60, the pivot shaft 20 is driven by the releasing switch 60 to rotate, and the rotation of the pivot shaft 20 further drives the body 41 of the pushing member 40 to swing pivotally. At this point, the direction of the pivotal swinging of the body 41 of the pushing member 40 is opposite to the direction of the pivotal swinging produced by downwardly pressing the pushing member 40. As such, at the fastening position, because of the reverse pivotal swinging of the swing seat 412, the state of the second positioning end 4112 of the guide positioning groove 411 corresponding to the positioning shaft 42 is restored to the releasing pushing position of the position of the first positioning end 4111 of the guide positioning groove 411 relative to the positioning shaft 42. Meanwhile, the fastening portion 30 is also pivotally rotated in reverse to return to the releasing pushing position.

It is known from the foregoing embodiments that, the fastening and releasing pushing module of the present invention can drive the pushing member 40 during the downward pressing process of mounting the electronic device. The pushing member 40 drives the pivot shaft 20, and the pivot shaft 20 then drives the fastening portion 30 to become hooked with the electronic device, thus positioning the electronic device through the above consecutive actions. To separate the electronic device, a downward pressing operation of pressing the releasing switch 60 can drive the pivot shaft 20 through the releasing switch 60, the pivot shaft 20 drives the fastening portion 30 to separate from the electronic device, and the pivot shaft 20 simultaneously drives the pushing member 40 to restore to the releasing pushing position, thus releasing the electronic device and restoring to the releasing pushing position through the above consecutive actions.

Referring to FIG. 2 and FIG. 4, in one embodiment, the body 41 of each of the pushing members 40 and the pivot shaft 20 can be respectively driven by a driving member 70 that is provided between the body 41 and the pivot shaft 20. More specifically, the driving member 70 is a bent plate structure. At this point, the driving member 70 includes a first driving section 71 and a second driving section 72 engaged with each other, wherein there is an included angle between the first driving section 71 and the second driving section 72. Furthermore, the first driving section 71 is fixedly provided at the tongue 413 of the body 41 of the pushing member 40, and the second driving section 72 is fixedly provided at the pivot shaft 20. After assembly, the tongue 413 of the body 41 is located between the swing seat 412 and the second driving section 72. Accordingly, the driving member 70 and the pivot shaft 20 can synchronously pivotally rotate and drive the body 41 of the pushing member 40 to swing pivotally.

Figure 5:
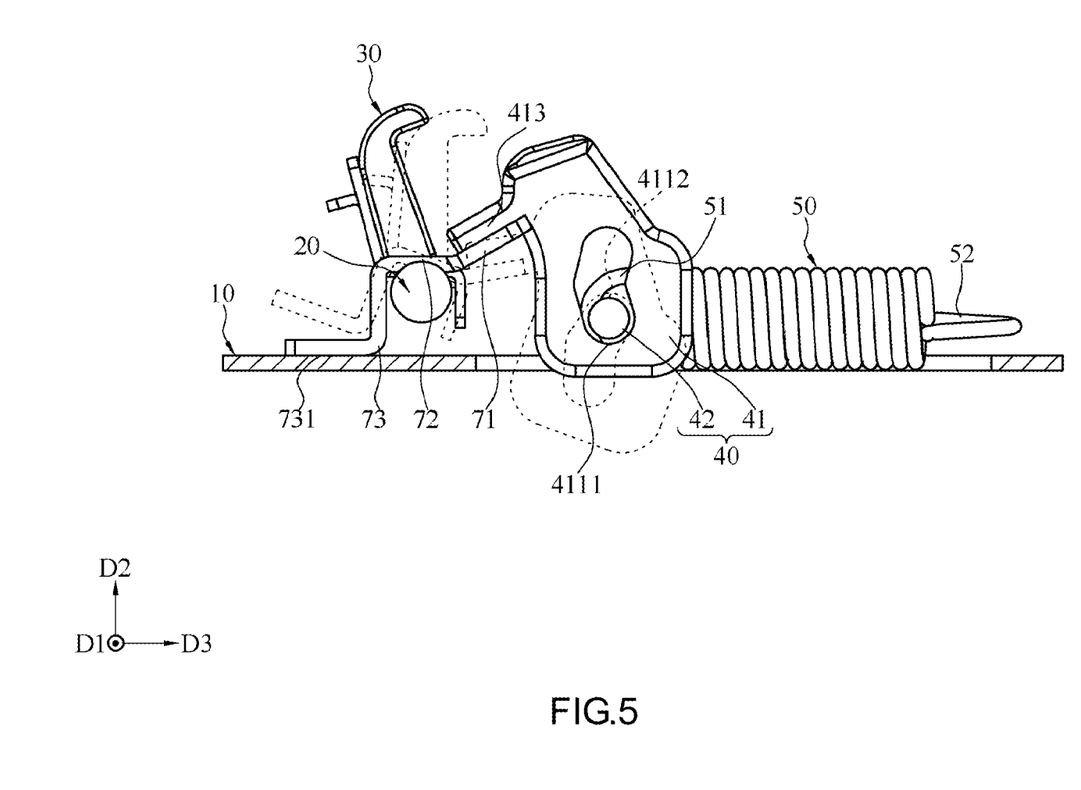
FIG. 5 is a variation diagram of a fastening and releasing pushing module at a releasing pushing position and a fastening position according to an embodiment of the present invention.

In another embodiment, referring to FIG. 1 to FIG. 5, FIG. 5 shows a variation diagram of a fastening and releasing pushing module located at a releasing pushing position and a fastening position according to an embodiment of the present invention. In FIG. 5, the solid line represents the state in which the fastening portion 30 and the pushing member 40 are located at the releasing pushing position, and the dotted line represents a state in which the fastening portion 30 and the pushing member 40 are located at the fastening position. In this embodiment, the driving member 70 further includes a limiting section 73, and the limiting section 73 and the first driving section 71 are respectively located on two sides of the second driving section 72. At this point, the limiting section 73 is a right-angled plate structure and has a planar surface 731. When the fastening and releasing pushing module is located at the releasing pushing position, the planar surface 731 of the limiting section 73 of the driving member 70 is abutted against the base 10. Thus, as the planar surface 731 of the driving member 70 is abutted against the base 10, the rotation direction of the driving member 70 is limited to unidirectional rotation, ensuring that the fastening and releasing pushing module can only be changed towards the fastening position when being located at the releasing pushing position, thereby enhancing operation certainty.

Furthermore, in one embodiment, referring to FIG. 1 and FIG. 3, the two pushing members 40 are provided at positions on the base 10 near the sidewalls 11, and each of the pushing members 40 is located between the sidewalls 11 and the vertical walls 12. At this point, to ensure the movement certainty of the body 41 of the pushing member 40, a lateral groove 15 is provided on each of the sidewall 11 and the vertical wall 12 on the two sides of the pushing member 40, wherein the lateral groove 15 extends along the third direction D3. In addition to passing through and being provided at the guide positioning groove 411, the positioning shaft 42 of each of the pushing members 40 can also simultaneously pass through and be movably provided at the lateral grooves 15 of the sidewalls 11 and the vertical walls 12. As such, the lateral grooves 15 can limit the positioning shafts 42 in fixed positions in the second direction D2, and allow the positions of the positioning shafts 42 to change only in the third direction D3.

Thus, during the process of the position of the body 41 of the pushing member 40 changing between the fastening position and the releasing pushing position, the position of each of the positioning shafts 42 is limited to change only in the third direction D3, and the pushing member 40 is accordingly limited to correspond portions of the guide positioning groove 411 at different positions in the third direction D3 to the positioning shaft 42, and at the same time ensures the pivotal swinging motion of the pushing member 40.

Figure 6:
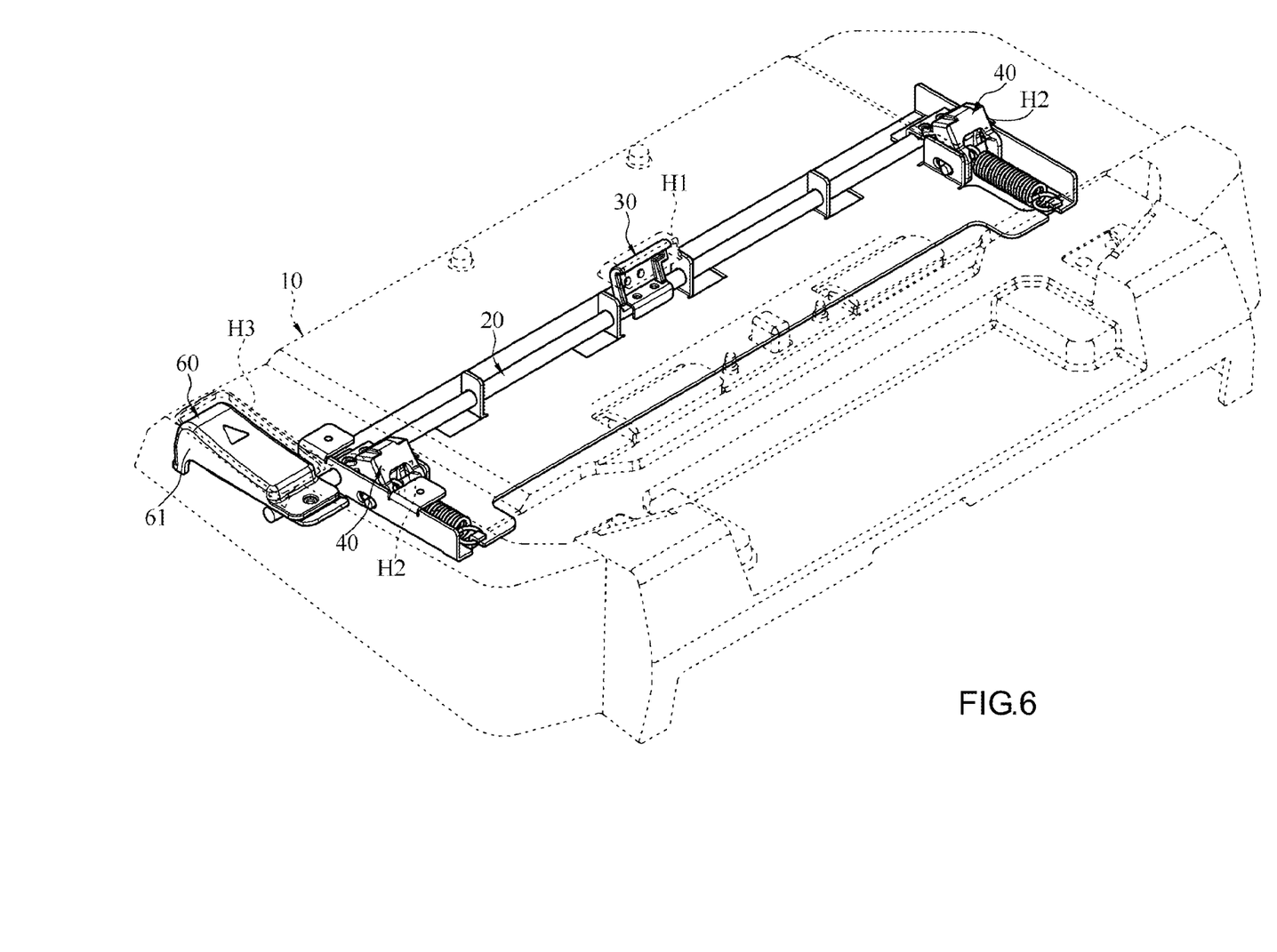
FIG. 6 is a schematic diagram of a fastening and releasing pushing module at a releasing pushing position and coordinating with a housing to serve as a docking station according to an embodiment of the present invention.
Figure 7:
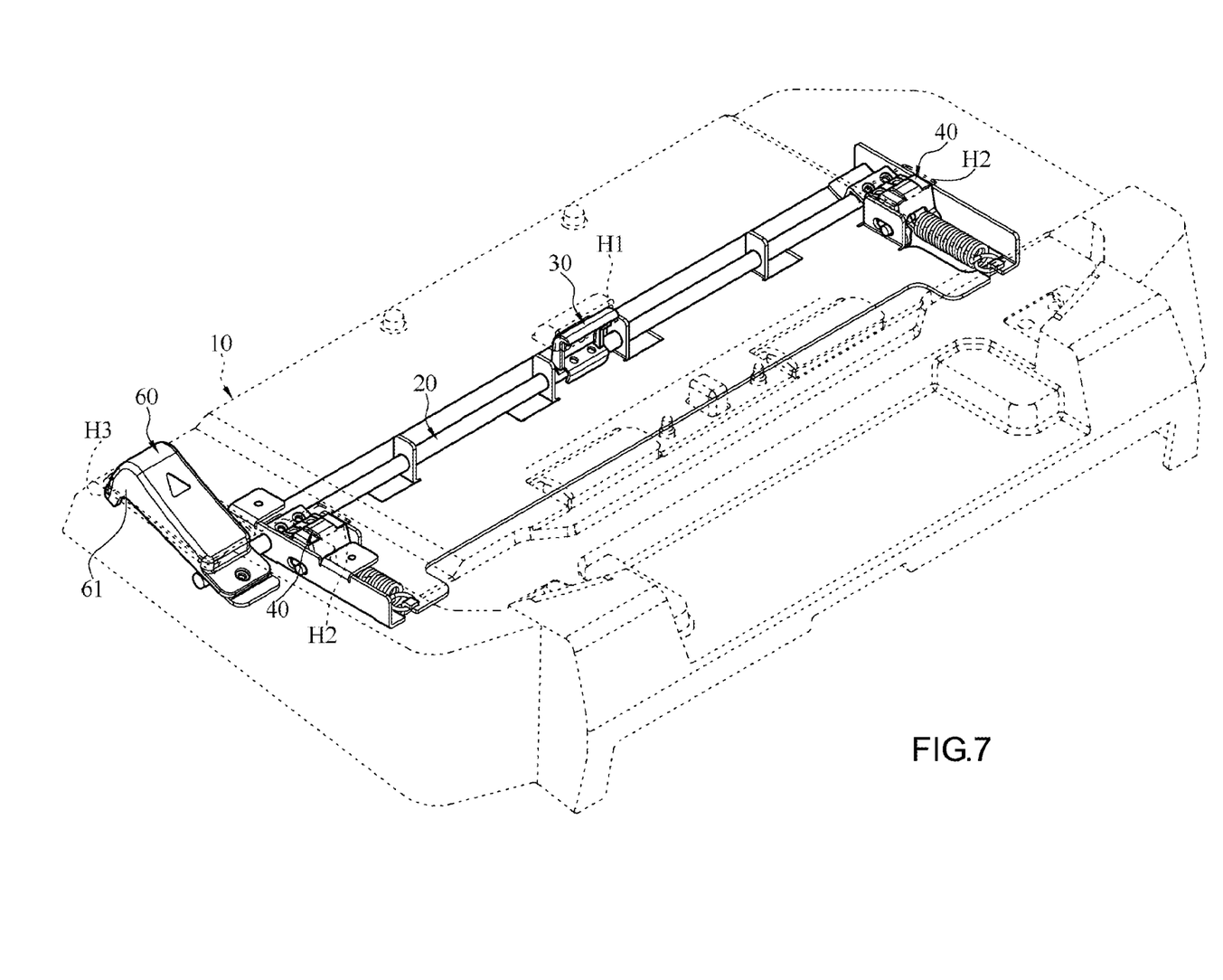
FIG. 7 is a schematic diagram of a fastening and releasing pushing module at a fastening position and coordinating with a housing to serve as a docking station according to an embodiment of the present invention.

Refer to FIG. 6 and FIG. 7. FIG. 6 shows a schematic diagram of a fastening and releasing pushing module at a releasing pushing position and coordinating with a housing H to serve as a docking station according to an embodiment of the present invention. FIG. 7 shows a schematic diagram of a fastening and releasing pushing module at a fastening position and coordinating with a housing H to serve as a docking station according to an embodiment of the present invention. In this embodiment, the housing H has a first hole hl, two second holes H2 and a third hole H3. The position of the first hole H1 corresponds to the position of the fastening portion 30 and allows the fastening portion 30 to extend out. The second holes H2 are respectively located on two sides of the first hole H1 and correspond to the positions of the pushing members 40, and allow the pushing members 40 to extend out. The position of the third hole H3 corresponds to the position of the releasing switch 60 and allows the operation end 61 of the releasing switch 60 to extend out.

Refer to FIG. 6 showing a fastening and releasing pushing module in a state of being located at a releasing pushing position. In this above state, the fastening portion 30 is located in the first hole H1, that is to say, the fastening portion 30 at the releasing pushing position is in a released state from the electronic device. The pushing members 40 are extended out via the respective second holes H2 for the electronic device to press and drive the pivot shaft 20. Furthermore, the operation end 61 of the releasing switch 60 is not extended out of the third hole H3. In such state, a user can intuitively place the electronic device on the housing H, and the electronic device placed on the housing H simultaneously presses the pushing members 40 to drive the pivot shaft 20 to rotate, such that the fastening portion 30 pivotally rotates and is extended out of the first hole H1 to combine with the electronic device. At this point, the fastening and releasing pushing module is also changed to the fastening position.

Refer to FIG. 7 showing a fastening and releasing pushing module in a state of being located at a fastening position. In such state, the fastening portion 30 is extended out of the first hole H1 to be combined with the electronic device, the pushing members 40 are pressed by the electronic device and thus withdrawn into the respective second holes H2, and the operation end 61 of the releasing switch 60 is pivotally rotated and extended out of the third hole H3. At this point, the fastening portion 30 and the pushing members 40 are all hidden by the electronic device. Thus, to release the electronic device, a user can intuitively press the operation end 61 of the releasing switch 60, and the pivot shaft 20, the fastening portion 30 and the pushing members 40 are then driven through the releasing switch 60 to restore to the releasing pushing position.

While the invention has been disclosed in the above embodiments, it is to be understood that the invention is not limited thereto. Modifications and variations can be made by a person skilled in the art without departing from the spirit and scope of the present invention. Therefore, the scope of the patent protection of the present invention should be defined by appended claims.

What is claimed is:

1. A fastening and releasing pushing module, comprising:
   a base;
   a pivot shaft, provided at the base;
   a fastening portion, provided at the pivot shaft;
   two pushing members, provided at the pivot shaft, each of the pushing members comprising a body and a positioning shaft, the positioning shaft assembled at the body;
   two elastic elements, one end of each of the elastic elements directly connected to the positioning shaft of the pushing member and one other end connected to the base; and
   a releasing switch, provided at the pivot shaft;
   wherein the releasing switch is movable between a fastening position and a releasing pushing position; when the releasing switch moves to the fastening position or the releasing pushing position, the releasing switch drives the pivot shaft to rotate, such that the fastening portion and the pushing members simultaneously rotate to the fastening position or the releasing pushing position.

2. The fastening and releasing pushing module according to claim 1, wherein the body comprises a guide positioning groove, the positioning shaft passes through and is movably provided at the guide positioning groove, the guide positioning groove comprises a first positioning end, a second positioning end, and a bent portion located between the first positioning end and the second positioning end.

3. The fastening and releasing pushing module according to claim 2, wherein the bent portion of the guide positioning groove has an included angle greater than 90 degrees and smaller than 180 degrees.

4. The fastening and releasing pushing module according to claim 2, wherein the body comprises a swing seat and a tongue, the tongue is located on one side of the swing seat, the guide positioning groove is located at the swing seat, the pivot shaft is extended along a first direction, and the first positioning end is, in a second direction perpendicular to the first direction, farther away from the tongue compared to the second positioning end.

5. The fastening and releasing pushing module according to claim 4, further comprising two driving members, each of the driving members provided between the body and the pivot shaft.

6. The fastening and releasing pushing module according to claim 5, wherein each of the driving members comprises a first driving section and a second driving section engaged with each other, the first driving section is provided at the tongue, the second driving section is provided at the pivot shaft, and the tongue is located between the swing seat and the second driving section.

7. The fastening and releasing pushing module according to claim 6, wherein there is an included angle between the first driving section and the second driving section.

8. The fastening and releasing pushing module according to claim 7, wherein the base has two sidewalls opposite to each other, each of the two sidewalls has a lateral groove, one end of the positioning shaft of each of the pushing members passes through and is movably provided at the lateral groove, and the lateral groove extends along a third direction perpendicular to the first direction and the second direction.

9. The fastening and releasing pushing module according to claim 8, wherein the two sidewalls are formed by integrally bending the base.

10. The fastening and releasing pushing module according to claim 7, wherein the driving member further comprises a limiting section, the limiting section and the first driving section are respectively located on two sides of the second driving section, the limiting section has a planar surface, and the planar surface is abutted against the base and the positioning shaft is located at the first positioning end when the releasing switch is located at the releasing pushing position.

* * * * *